United States Patent
Romano

(10) Patent No.: US 11,092,618 B2
(45) Date of Patent: Aug. 17, 2021

(54) OFFSET CANCELLATION DEVICE FOR MICRO-ELECTROMECHANICAL SYSTEM

(71) Applicant: STMicroelectronics, Inc., Coppell, TX (US)

(72) Inventor: Fabio Romano, Coppell, TX (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 16/593,162

(22) Filed: Oct. 4, 2019

(65) Prior Publication Data

US 2020/0033379 A1     Jan. 30, 2020

Related U.S. Application Data

(62) Division of application No. 15/895,692, filed on Feb. 13, 2018, now Pat. No. 10,473,691, which is a division of application No. 14/549,437, filed on Nov. 20, 2014, now Pat. No. 9,921,239.

(51) Int. Cl.

| | |
|---|---|
| *G06G 7/18* | (2006.01) |
| *G01P 21/00* | (2006.01) |
| *G01C 25/00* | (2006.01) |
| *H03F 3/70* | (2006.01) |
| *G01P 15/00* | (2006.01) |
| *H03K 5/003* | (2006.01) |

(52) U.S. Cl.
CPC ............. *G01P 21/00* (2013.01); *G01C 25/005* (2013.01); *G01P 15/00* (2013.01); *H03F 3/70* (2013.01); *H03K 5/003* (2013.01); *H03F 2200/375* (2013.01)

(58) Field of Classification Search
CPC .................................. G01P 21/00; G06G 7/18

USPC ............................................ 73/488; 327/307
See application file for complete search history.

(56) References Cited

U.S. PATENT DOCUMENTS

| | | | |
|---|---|---|---|
| 7,538,595 B2 | 5/2009 | Chang et al. | |
| 7,586,335 B2 | 9/2009 | Werker et al. | |
| 7,760,124 B2 | 7/2010 | Trescases | |
| 8,164,928 B2 | 4/2012 | Lin et al. | |
| 9,438,214 B2 | 9/2016 | Yen | |

(Continued)

FOREIGN PATENT DOCUMENTS

| | | |
|---|---|---|
| CN | 101982935 A | 3/2011 |
| DE | 1 611 205 A1 | 12/1970 |
| EP | 0 794 436 A1 | 9/1997 |

OTHER PUBLICATIONS

BOSCH Reutlingen, Data Sheet CB920, Part No. 1279993127, Nov. 23, 2000, 35 pages.

(Continued)

*Primary Examiner* — Hai L Nguyen
(74) *Attorney, Agent, or Firm* — Seed Intellectual Property Law Group LLP

(57) ABSTRACT

The present disclosure is directed to a system that includes a sensor and a signal conditioner coupled to the sensor. The signal conditioner includes signal processing circuitry coupled to the sensor and offset cancellation circuitry. The offset cancellation circuitry includes a sign detector configured to output a high signal or a low signal based on a sign of an output signal from the signal processing circuitry, an integrator coupled to the sign detector, and a divider coupled to the integrator and to an input of the signal processing circuitry.

14 Claims, 5 Drawing Sheets

(56) References Cited

U.S. PATENT DOCUMENTS

| | | |
|---|---|---|
| 9,921,239 B2 | 3/2018 | Romano |
| 10,224,910 B1 * | 3/2019 | Chang ................. H04L 25/4917 |
| 10,473,691 B2 * | 11/2019 | Romano .............. G01C 25/005 |
| 2005/0258840 A1 | 11/2005 | Ausserlechner |
| 2008/0013665 A1 | 1/2008 | Werker et al. |
| 2012/0133406 A1 | 5/2012 | Fant et al. |

OTHER PUBLICATIONS

Freescale Semiconductor, Data Sheet: Technical Data, Dual-Axis SPI Inertial Sensor, Document No. MMA68xx, Rev. 4, Dec. 2011, 54 pages.

Freescale Semiconductor, Data Sheet: Technical Data, PSI5 Inertial Sensor, Document No. MMA52xxKW, Rev. 9, Mar. 2012, 55 pages.

* cited by examiner

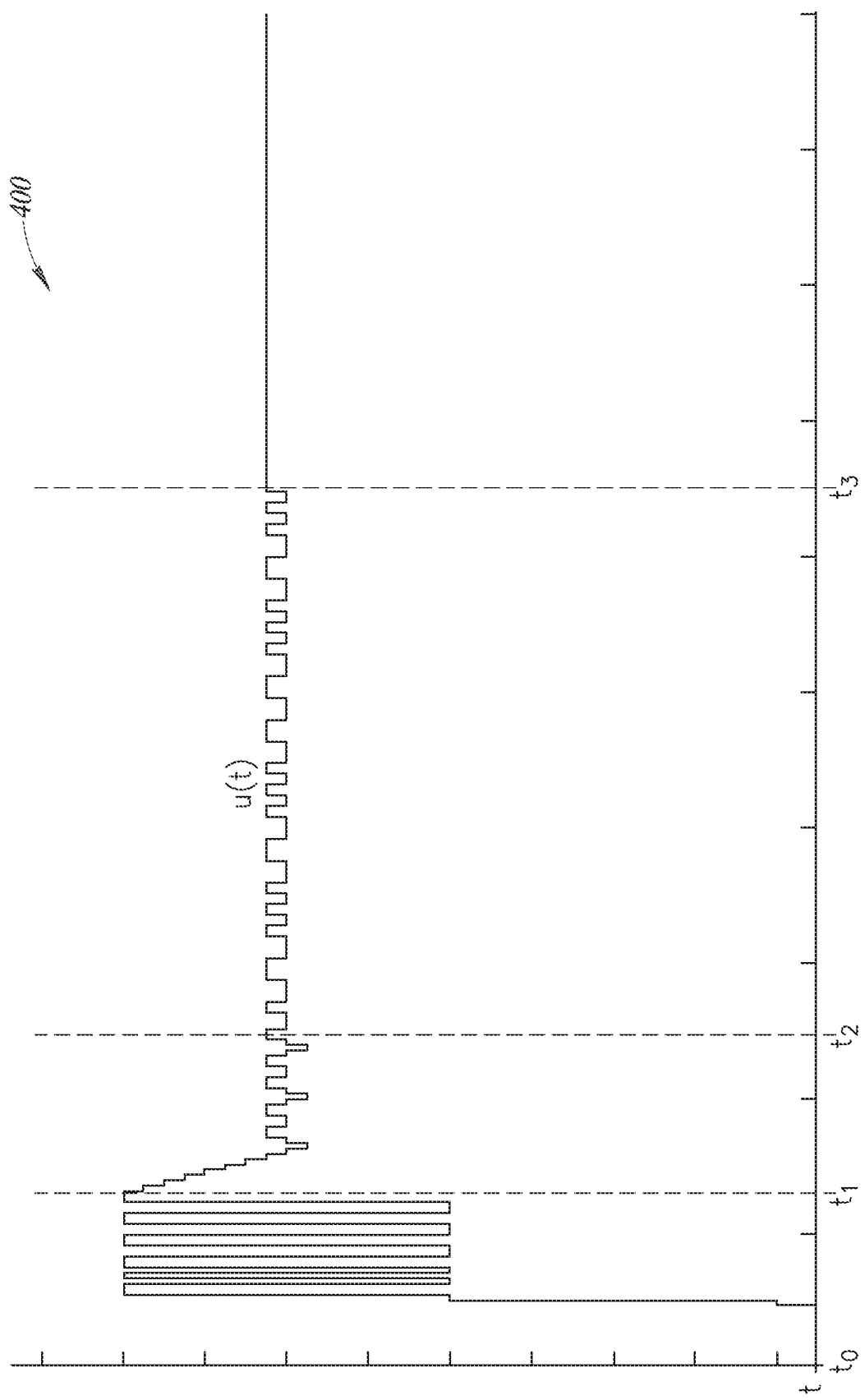

OFFSET CANCELLATION DEVICE FOR MICRO-ELECTROMECHANICAL SYSTEM

BACKGROUND

Technical Field

The present disclosure relates to a device and method for removing an offset from a signal during a startup sequence and during normal operation of a MEMS device.

Description of the Related Art

Micro-electromechanical system (MEMS) sensors are integrated into many different types of consumer electronic devices, such as in cell-phones, tablets, and game controllers to name a few. Analog reading circuitry is coupled to the MEMS sensors to process the movement or other parameters detected by the MEMS sensors. Typically, an output of the analog reading circuitry is non-zero even when an input signal is zero. An offset is introduced by the MEMS sensor and sometimes by the reading circuitry. Many known systems remove this offset with a low-pass filter.

BRIEF SUMMARY

Embodiments of the present disclosure are directed to removing an offset that is introduced by a micro-electromechanical system (MEMS) sensor, such as an accelerometer, and associated analog reading circuitry. The offset can be removed during a start-up operation as well as during a normal operation. The present disclosure is directed to a device and method to remove a DC input signal, the offset, during all modes of operation.

One embodiment of the present disclosure is directed to a device that includes analog reading circuitry having a negative feedback system. A digitally filtered output signal is fed back into an offset cancellation module. The offset cancellation module is coupled and controls a digital to analog converter. The offset cancellation module changes a gain of the system. The gain is moved in a direction opposite to the offset introduced by the MEMS sensor and the analog reading circuitry. A sign of the digitally filtered output signal drives the digital to analog converter.

BRIEF DESCRIPTION OF THE SEVERAL VIEWS OF THE DRAWINGS

The foregoing and other features and advantages of the present disclosure will be more readily appreciated as the same become better understood from the following detailed description when taken in conjunction with the accompanying drawings.

FIG. 4 is an alternative time plot of the offset cancellation system response;

DETAILED DESCRIPTION

Figure 1:
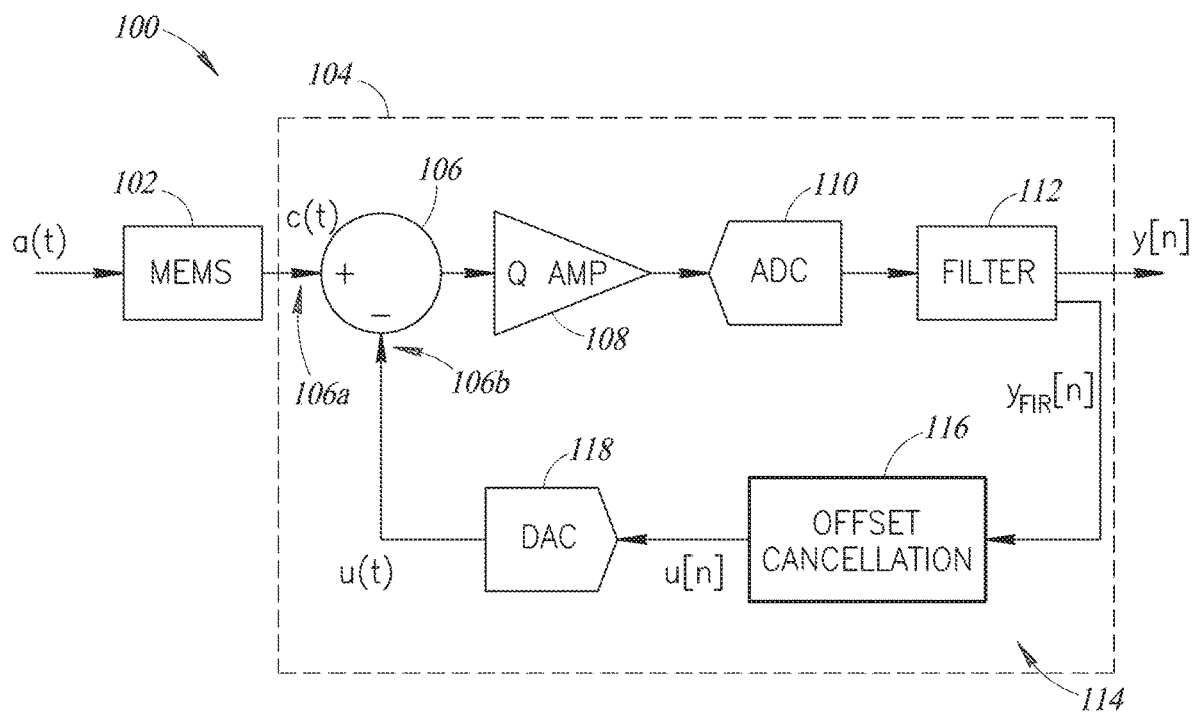
FIG. 1 is one embodiment of a block diagram for a device including an offset cancellation module.

In the following description, certain specific details are set forth in order to provide a thorough understanding of various embodiments of the disclosure. However, one skilled in the art will understand that the disclosure may be practiced without these specific details. In other instances, well-known structures associated with signal conditioning devices have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

As used in the specification and appended claims, the use of "correspond," "corresponds," and "corresponding" is intended to describe a ratio of or a similarity between referenced objects. The use of "correspond" or one of its forms should not be construed to mean the exact shape or size.

In the drawings, identical reference numbers identify similar elements or acts. The size and relative positions of elements in the drawings are not necessarily drawn to scale.

Micro-electromechanical sensors are used to detect a variety of conditions, including sounds, chemicals, electrical signals, fluid flow, environmental, position, movement, light, force, pressure, proximity, or any other condition. An output from the sensor is often be skewed by an offset. The offset is present from the nature of the condition being sensed, e.g. the acceleration of gravity biasing an accelerometer, or is present from the nature of the sensor, e.g. the sensor output moves around a non-zero offset. Some systems perform better when an offset has been removed from the sensor output, and in these systems it may be preferential to remove the offset as quickly as possible. This disclosure provides a system for quickly removing the offset in the sensor.

FIG. 1 is a block diagram for a device 100 including an offset cancellation system according to an embodiment of the present disclosure. A sensor device 100 includes a micro-electromechanical structure (MEMS) sensor 102 coupled to a signal conditioner 104. The signal conditioner may be an application specific integrated circuit (ASIC) or some other type of device. The signal conditioner 104 receives an input from the MEMS sensor 102 at a first terminal 106a of a combiner 106. The input from the MEMS sensor 102 often includes an offset. The MEMS sensor 102 outputs an analog signal representative of the parameter measured by the MEMS sensor 102. The offset may be a DC signal included with the analog signal.

The combiner 106 is coupled to a charge amplifier 108. The charge amplifier is coupled to an analog-to-digital converter (ADC) 110. The ADC is coupled to a filter 112. The signal conditioner 104 generates a digital output y[n] as an output of the filter 112. The filter 112 also generates a signal $y_{FIR}[n]$ that is provided to an offset cancellation system 114. In one embodiment, the signal $y_{FIR}[n]$ is substantially similar to the digital output y[n] of the sensor device 100. In another embodiment, the digital output y[n] may have a waveform similar to the signal $y_{FIR}[n]$, but is scaled differently or has a different sampling frequency. In a preferred embodiment, the charge amplifier 108 is a charge to voltage amplifier.

The offset cancellation system 114 includes an offset cancellation module 116 and a digital-to-analog converter (DAC) 118. The offset cancellation module 116 is configured to remove the offset included in the analog signal from the MEMS sensor 102. By removing the offset from the output of a MEMS sensor, the system prevents asymmetric saturation of a MEMS sensor read device. The offset cancellation module 116 receives the signal $y_{FIR}[n]$ and generates a digital signal u[n], which may be an offset. The offset cancellation module 116 is coupled to the DAC 118 which produces an analog offset u(t). The DAC 118 is coupled to a second terminal 106b of the combiner 106 and provides the analog offset u(t) to the combiner 106.

The MEMS 102 can be a sensor configured to generate a sensed signal c(t) based on a sensed condition a(t). The MEMS 102 may be any number of sensors, including but not limited to: acoustic, chemical, electrical, flow, environmental, position, navigation, optical, force, pressure, temperature, proximity, and any other sensor. The sensed signal c(t) from the sensor may be electrical, mechanical, optical, or any other output signal for processing by the signal conditioner. In one embodiment, the MEMS 102 is an accelerometer that outputs a signal representing a charge proportional to sensed acceleration. In this embodiment the accelerometer may have a sensing range of 240 to −240 g's of acceleration and a sensitivity of about 17 least significant bits (LSB)/g.

The combiner 106 is configured to receive the sensed signal c(t) from the MEMS 102 and combine it with the analog offset u(t) received from the offset cancellation system 114. The combiner 106 may be an adder, a subtractor, a compiler, a summer, or any other device that combines two inputs. In one embodiment, the combiner 106 is configured to add the sensed signal c(t) from the MEMS 102 with an inverted signal from the offset cancellation system 114.

The charge amplifier 108 amplifies the output from the combiner 106. In a preferred embodiment, the charge amplifier converts a charge signal generated by the combiner 106, and converts it into a corresponding voltage signal.

The ADC 110 may convert the output of the charge amplifier into a digital signal. In one embodiment, the output digital signal is a 12 bit signal. The 12 bit signal is capable of representing 4096 unique values, 12 bits being the minimum number of bits required to represent a signed analog signal ranging from 120 to −120 g's with a sensitivity of 17 LSB/g. In another embodiment, the signed analog signal may range from 240 to −240 g's, which would have 13 bits. The output digital signal of the ADC 110 can be provided to the filter 112.

The filter 112 receives the output digital signal of the ADC 110 and performs signal filtering on the digital signal of the ADC. In one embodiment, the filtering is equivalent to a digital low pass filter with a sampling frequency of 16 KHz and a step response period or time of 1.5 ms. In this embodiment, the first output of the filter 112 may be a 12 bit signal that is the digital output y[n] of the signal conditioner 104 and a second output may be a 12 bit signal that is the signal $y_{FIR}[n]$ of the offset cancellation system 114. In one embodiment, the filter 112 includes a plurality of filtering elements, such as a CIC decimator cascaded with a low pass filter and a linear interpolator. In this embodiment, $y_{FIR}[n]$ is the output of cascade formed by the CIC decimator and the low pass filter. The linear interpolator does not contribute to $y_{FIR}[n]$. The output y[n] is generated by the linear interpolator.

The offset cancellation system 114 is configured to receive the output of the filter 112 and generate the analog offset u(t) representative of a DC offset in the sensed signal c(t) from the MEMS 102. The analog offset u(t) is provided to a second terminal of the combiner 106 to be combined with the sensed signal c(t) from the MEMS 102 at the first terminal of the combiner 106. The offset cancellation system 114 may include the offset cancellation module 116 and the DAC 118.

The offset cancellation module 116 can be coupled to an input of the offset cancellation system 114. In one embodiment, the offset cancellation module 116 generates a digital offset u[n] representative of the DC offset, and provides the digital offset u[n] to the DAC 118.

The DAC 118 may receive the digital offset u[n], and convert it into a corresponding analog signal, the analog offset u(t). The analog offset u(t) from the DAC 118 can be provided to the output of the offset cancellation system 114 which can be coupled to the second terminal of the combiner 106.

In one embodiment, the signal conditioner 104 implements a digital band-pass filter on a digitized signal of the MEMS sensed signal c(t). In this embodiment, the filter 112 effectively removes frequencies above a first cutoff frequency, a filter cutoff frequency and the offset cancellation system 114 effectively removes frequencies below a second cutoff frequency, an offset cutoff frequency. The first cutoff frequency is preferably higher than the second cutoff frequency. The band-pass filter may be implemented using cascaded low pass filters in one embodiment. In this alternative embodiment, the signal conditioner 104 includes a first low pass filter that filters the output of the combiner 106, and a second low pass filter that filters an output of the signal conditioner 104. The first low pass filter outputs an output signal of the signal conditioner 104 and the second low pass filter outputs an output of the offset cancellation system 114 which may be inverted and combined with an input of the signal conditioner 104.

In one embodiment, the first and second cutoff frequencies and step response of the signal conditioner 104 are dynamic. The first and second cutoff frequencies and step response may vary with respect to time, signal values, or other conditions. In one embodiment, the cutoff frequencies and step response can be variable across multiple modes, each mode either fixed or programmable. Additionally, conditions for the use of each profile of first and second cutoff frequencies and step response may be fixed or programmable by a user.

In one embodiment, the cutoff frequencies and step response of the signal conditioner 104 vary over time intervals. On power up and initialization of the MEMS, the signal conditioner 104 enters a first mode. In the first mode, the cutoff frequency of the filter 112 is set to a filter cutoff frequency and the cutoff frequency of the offset cancellation module 116 is set to a first offset cutoff frequency. The slew rate of the offset cancellation module 116 is set to a first slew rate. The first slew rate can be set to reach the expected offset within the duration of the first mode, and in one embodiment is 1.6 LSB/ms. The sensor device 100 may include an internal timing circuit or may receive an external timing signal that sets the frequency of the cycles. In one embodiment, the frequency of the cycles is controlled by an internal clock that is 500 Hz, which is a period of 2 ms. The first time period can be any time period desired by a user, and in one embodiment it is 64 ms.

After the first time period, a second time period may begin during which the signal conditioner 104 operates in a second mode. In the second mode the cutoff frequency of the filter 112 may be held constant at the filter cutoff frequency. The cutoff frequency of the offset cancellation module 116 may be changed from the first offset cutoff frequency to a second offset cutoff frequency. In one embodiment, the second offset cutoff frequency is lower than the first offset cutoff frequency. Additionally, in the second mode the slew rate may be changed from the first slew rate to a second slew rate with the second slew rate being smaller than the first slew rate. In one embodiment the second slew rate is 0.1 LSB/ms.

The second period can be any time period desired by a user, and in one embodiment is 64 ms. Alternatively, the second time period may continue until a change in state of the sensor device 100, such as power being removed from the MEMS 102 or signal conditioner 104 with the signal conditioner 104 starting the sequence again at time equal to zero when power is reapplied to the MEMS 102 or signal conditioner 104. Alternatively, the sequence of time periods may be resettable without interrupting power to the sensor device 100.

Optionally, after the second time period expires, a third time period begins during which the signal conditioner 104 operates in a third mode. In the third mode the cutoff frequency of the filter may be held constant at the filter cutoff frequency. The cutoff frequency of the offset cancellation module 116 may be changed from the second offset cutoff frequency to a third offset cutoff frequency. In one embodiment, the third offset cutoff frequency is lower than the second offset cutoff frequency. Additionally, in the third mode the slew rate may be changed from the second slew rate to a third slew rate with the third slew rate being smaller than the second slew rate. In one embodiment the third slew rate is 0.05 LSB/ms.

The third period can be any time period desired by a user, and in one embodiment the second time period is 64 ms and the third time period is 200 ms. In another embodiment, the third period may be optimized for the general operating conditions of the sensor device 100 indefinitely. In this case, the third time period may continue until a change in state of the sensor device 100, such as power being removed from the MEMS 102 or signal conditioner 104 with the signal conditioner 104 starting again at time equal zero when power is reapplied to the MEMS 102 or signal conditioner 104. Alternatively, the sequence of time periods may be resettable without interrupting power to the sensor device 100.

The three modes of the sensor device 100 can optimize the operation of the signal conditioner. In one embodiment, the first mode has a relatively high second cutoff frequency (an offset cutoff frequency) that results in a fast response to a differential signal between the output of the MEMS 102 and the output of the signal conditioner 104. In the first mode, the signal conditioner 104 is configured to quickly respond to a DC offset in the output of the MEMS 102. This system will quickly respond to and cancel out changes in the output of the MEMS 102, suppressing the sensed condition a(t) readings of the MEMS 102.

As a way to counteract the suppression of the sensed condition a(t) readings from the MEMS 102, each successive mode reduces the slew rate and reduces the offset cutoff frequency of the signal conditioner 104 to changes in the output of the MEMS 102. A slower response in the second or third mode enables the signal conditioner 104 to follow and as consequence to remove with great accuracy the offset introduced by the MEMS 102 and the analog circuits 108 and 110.

The offset in the sensed signal c(t) may be from a number of sources and may be present at time equal to zero, when the sensor device 100 is powered on, or alternatively may develop during operation of the MEMS 102 or signal conditioner 104. In the case of the MEMS 102 being an accelerometer, the offset may be induced by detecting the acceleration of gravity present from the mass of the earth. The accelerometer initial offset may also vary according to the orientation and altitude of the accelerometer. Other sensors within the scope of this disclosure can also have factors that lead to various offset conditions in the sensors, either present at startup or that develop during operation.

The sequence of the three modes enables the signal conditioner 104 to quickly capture an offset present in the sensed signal c(t) from the MEMS. The three modes allow for the system to adjust and provide a different step per mode, such that the system becomes accurate in removing the offset in the second and third modes.

Figure 2:
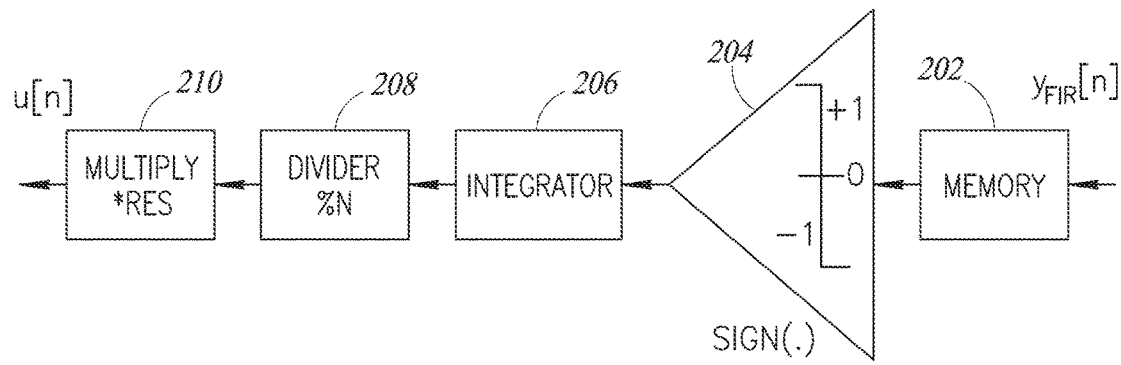
FIG. 2 is a block diagram of the offset cancellation module of FIG. 1.

FIG. 2 is one embodiment of the offset cancellation module 116 of FIG. 1. In one embodiment, the input of the offset cancellation module 116 is coupled to a memory 202. The memory 202 may be a flip-flop or any other suitable storage device. The memory may be a transient storage device that latches the digital output $y_{FIR}[n]$ at a read frequency $F_S$. In one embodiment, the read frequency $F_S$ is set to 4,000 Hz. The memory 202 is configured to constantly output a signal that represents the last input signal to the memory 202.

The output of the memory 202 is read by a sign detector 204. The sign detector 204 may output either a high signal or a low signal based on a sign of the output of the memory 202. In one embodiment the high and low signals are analog signals at different voltages. In another embodiment, the high and low signals are digital signals with different values. In yet another embodiment, the sign detector 204 outputs a digital signal representing 1 for the high side signal and −1 for the low side signal.

The sign detector output 204 is coupled to an integrator 206. The integrator 206 may operate using a number of different mathematical methods. In one embodiment the integrator 206 integrates the output of the sign detector 204 over an integration interval. The integration interval in a discrete system may be a number of values since the last integration. The integration interval in an analog system may be a time period to integrate over. The integration interval may also be a dynamic value that changes over time. In some embodiments, the integration interval may be user programmable. In another embodiment, the integration interval may vary over the three time periods. In one embodiment, the integration interval increases in each successive one of the three time periods.

The output of the integrator 206 is coupled to a divider 208 to calculate an average value from the output of the integrator 206. In one embodiment, a discrete integrator output can be divided by the number of discrete values in the integration interval. In another embodiment, the analog integrator output can be divided by the time duration of the integration interval. Other relevant values can also be used to approximate an average value of the output of the integrator 206. The divider 208 may also be set to a dynamic value. In one embodiment, a divider denominator may be a number of discrete values, a duration of the integration interval, or some other relevant number that changes when the integration interval changes. In another embodiment, the divider denominator may vary over the three different time periods. The divider denominator may also increase in each successive one of the three time periods.

The multiplier 210 scales the signal from the divider 208 to be equally scaled as compared to the output of the MEMS 102 or to limit the effective slew rate of the offset cancellation module 116. The output of the multiplier 210 may be coupled to the combiner 106 along with the output of the MEMS 102, and the two signals combined as discussed above. Alternatively, the multiplier 210 may be a digital multiplier that outputs a digital signal which is provided to the DAC 118. The DAC 118 is coupled to the combiner 106 along with the output of the MEMS 102. In one embodiment, a multiplication coefficient of the multiplier 210 may be any number selected by a user. In another embodiment, the multiplication coefficient sets the steady state output of the multiplier 210 to be approximately equivalent to the steady state output of the MEMS 102. The multiplier may be a shift by multiple of 2. The multiplier may be a shifter, which can save silicon area during the manufacturing of the device.

The value of the multiplier has to be limited based on the parameters of the system to avoid problems of instability of the feedback system 104. The multiplier 210 in conjunction with the sign detector 204 limits the output of the signal conditioner 104 from changing more than a selected amount. In another embodiment, the multiplier 210 and sign detector 204 limit the change of the output of the feedback loop at each cycle to a selected step size. In this embodiment, with each cycle the offset cancellation system either increments one step up, or one step down based on the sign of the digital output $y_{FIR}[n]$.

Also, the multiplier coefficient may be dynamic. The changes in the multiplier coefficient may relate to changes in integration interval, such that in one embodiment the multiplier coefficient varies over three different time periods. The multiplier coefficient may decrease in each successive one of the three time periods.

In an alternate embodiment, the divider 208 and multiplier 210 can be combined into a single combined multiplier block, the combined multiplier block may scale the output of the integrator 206 based on a scaling factor. The scaling factor is a composite of the divider and multiplier functions. In one embodiment, the scaling factor is computed by taking the multiplication factor and dividing it by the integration interval.

The use of the sign detector 204 in one embodiment preserves performance of the signal conditioner 204 while simultaneously reducing circuit area as compared to an analog low pass filter in an offset cancellation system. The active analog components of the low pass filter include capacitors and resistors which are sized to generate the desired cutoff frequencies and to limit interference from other components. The sign detector 204 can be implemented using known digital circuit manufacturing techniques which can enable significantly smaller circuit area than the corresponding active analog components.

Figure 3A:
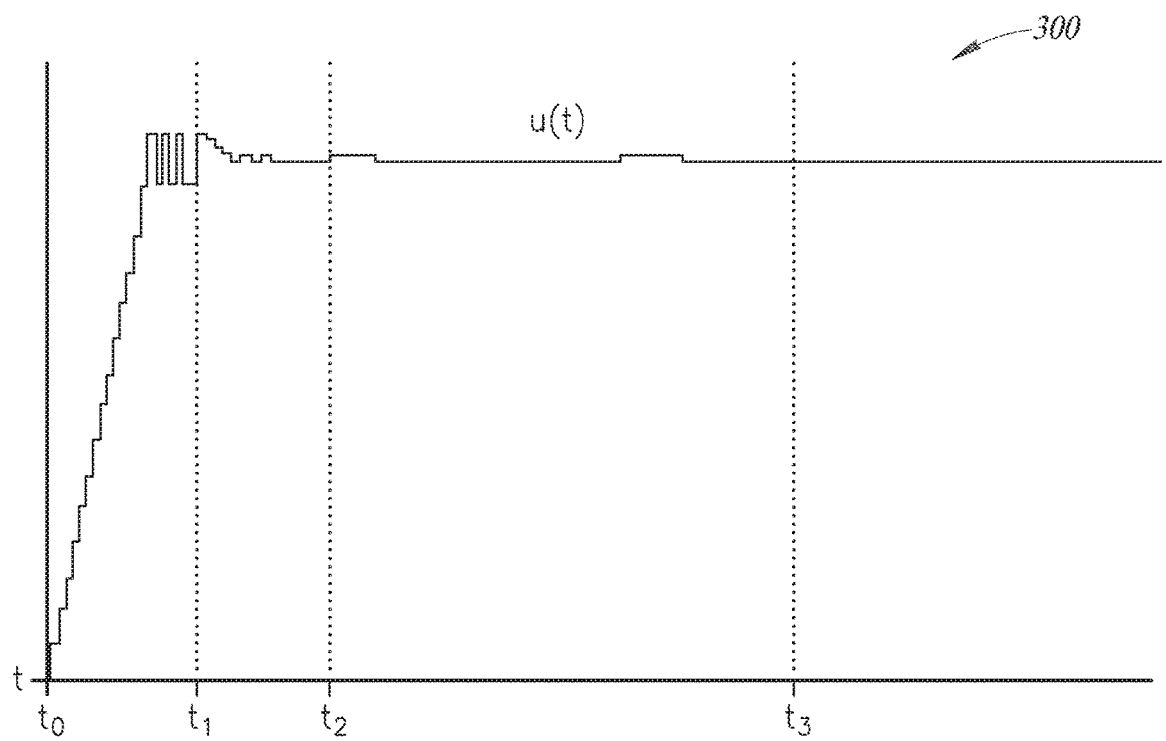
FIG. 3A is a time plot of an output of an offset cancellation system of FIG. 1.

FIG. 3A is a time plot 300 of the analog offset u(t) of the offset cancellation system 114 of FIG. 1. The u(t) may be an analog waveform coming from the equivalent digital waveform considering an ideal DAC. The time plot 300 is a representation of the magnitude of the output of the offset cancellation system 114 over time given a step input to the signal conditioner 104 at time equal to zero. In one embodiment, the signal conditioner 104 is turned on at time equal to zero. In an alternative embodiment, time is equal to zero following the activation of a reset sequence.

After time equal to zero the offset cancellation module 116 responds to a signal output by the MEMS 102 that propagates through the signal conditioner 104. FIG. 3A illustrates one embodiment of the response of the offset cancellation system to the sensed signal c(t) from the MEMS 102. In this embodiment the behavior of the offset cancellation module 116 varies over three different time periods.

According to one embodiment, the first time period begins at a zero time $t_0$ and lasts until a first time $t_1$. During the first time period, the integration interval is low, relatively small and the multiplier coefficient is high, relatively big. These parameters specified during the first time period result in an initial response by the offset cancellation module that approaches the MEMS first offset much faster than in the second or third time period. The change at each step can be based on a higher-lower determination made by the offset cancellation module 116, thus if the offset cancellation module 116 exceeds the MEMS first offset, then the offset cancellation module 116 will move around the MEMS first offset. In one embodiment, the multiplier coefficient is equal to 16 in the first time period. The integration time per step may also be set to a first step value.

The second time period begins at the first time $t_1$ and lasts until a second time $t_2$. The second time period might have a different multiplier coefficient or integration interval. As shown in FIG. 3A, the multiplier coefficient can be decreased such that the steps in the offset cancellation module output are smaller than in the first time period. The change at each step can be based on a higher-lower determination made by the offset cancellation 116, thus if the offset cancellation module 116 exceeds the MEMS first offset, then the offset cancellation module 116 will move around the MEMS first offset. In one embodiment, the multiplier coefficient in the second time period is 1. The integration time per step may also be set to a second step value which is bigger than the first step value, i.e., the integration time is longer with the second step value.

The third time period begins at the second time $t_2$ and lasts until a third time $t_3$. The third time period may also have a different multiplier coefficient or integration interval than either the first or second time periods. The multiplier coefficient can be decreased such that the steps in the output of the offset cancellation module 116 are smaller than in the second time period. The determination as to whether a step is made is based on a higher-lower determination made by the offset cancellation module 116, thus if the offset cancellation module 116 exceeds the MEMS first offset, then the offset cancellation module 116 will move around the MEMS first offset. In one embodiment, the multiplier coefficient in the third time period is 1. The integration time per step may also be set to a third step value which is bigger than the second step value i.e., the integration time is longer with the third step value.

The use of different modes with different effective slew rate limits and integration intervals allows a device to quickly initialize a sensor to remove an offset without causing a significant degradation in sensor performance in an operational mode of the sensor device 100. In the operational mode, the offset has been calculated and compensated for, and the offset cancellation module 116 then becomes much less responsive to inputs of the MEMS 102, allowing the signal conditioner 104 to pass signals from the MEMS 102 to a reading device without cancelling out the sensed signal c(t). The decrease in responsiveness is based on the parameters (integration time, divider value, and multiplier value) of the offset cancellation circuit, which are changed to take in account a situation without offset to be removed since the start-up offset has already been removed.

In another embodiment, the offset cancellation module 116 remains active during the operational mode of the sensor device 100, but with less responsiveness to the output of the MEMS 102. The offset of the MEMS 102 may change from a first offset to a second offset during the operational mode for a number of reasons, including: a change in power source, a change in environmental conditions unrelated to the designed sensing functions, a change in orientation of the MEMS, or any other of a number of reasons. By remaining active, the offset cancellation module 116 can adjust to a change in the offset of the MEMS 102 during the operational mode.

Figure 3B:
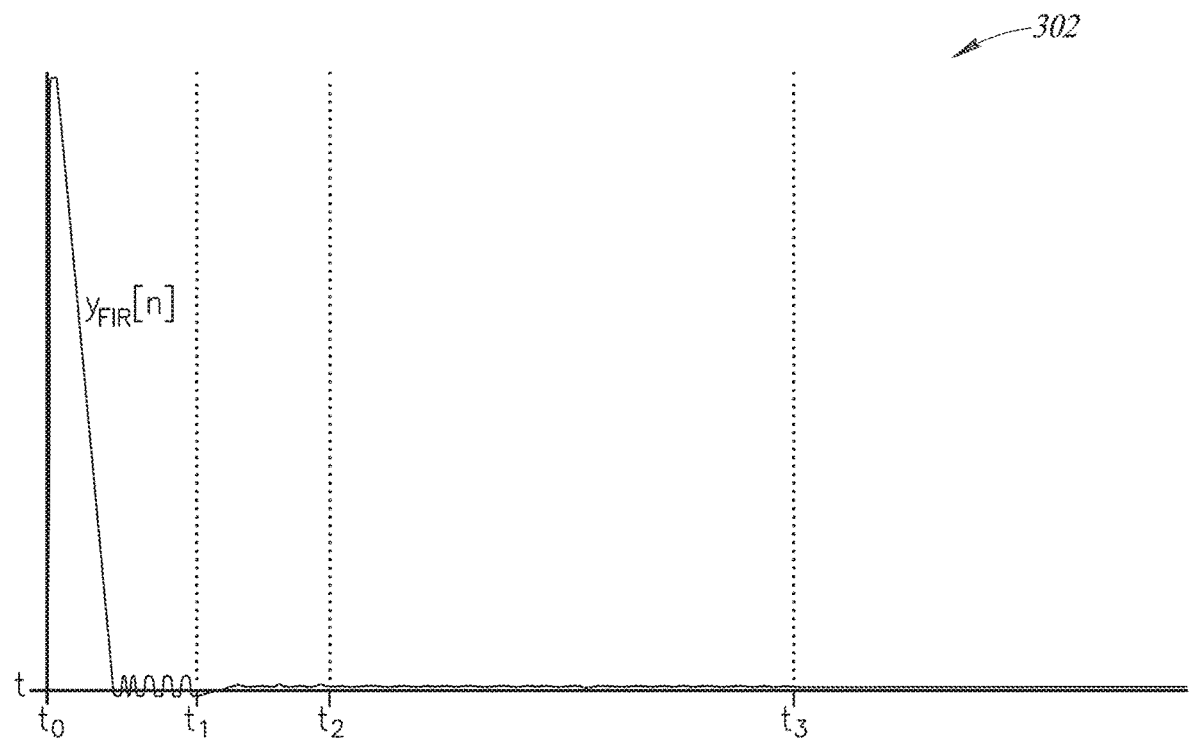
FIG. 3B is a time plot of an input of an offset cancellation system of FIG. 1.

FIG. 3B is a time plot 302 of the signal $y_{FIR}[n]$ of the offset cancellation system 114 of FIG. 1. The time plot 302 is a representation of the magnitude of the input of the offset cancellation system 114 over time given a step input to the signal conditioner 104 at time equal to zero. In the time plot 302, time may be equal to zero when the sensor device 100 is powered on, when the sensor device is reset, or at some other time.

As discussed previously with respect to FIG. 1, the filter 112 provides an output to the offset cancellation system 114 and the offset cancellation system output is combined with the MEMS 102 output as an input to the filter 112. Thus in one embodiment the signal $y_{FIR}[n]$ spikes initially as a response to a step input at time equal to zero because the offset cancellation system is not initially responding to the offset. In the first mode of the signal conditioner 104, the offset cancellation module determines that the digital output y[n] is greater than zero, and thus drives an increasing digital offset u[n] to remove the detected offset from the digital output y[n] and the signal $y_{FIR}[n]$, as can be seen in time plot 302.

When the digital offset u[n] passes the sensed signal c(t), the digital offset then begins to move around the value of the sensed signal c(t) until a first time $t_1$ that corresponds to the first time $t_1$ of time plot 300. This can be seen in time plot 302 where the signal $y_{FIR}[n]$ is oscillating around the axis where y=0.

At the first time $t_1$ the signal conditioner 104 enters into the second mode with a smaller step size and larger integration time than the first mode, according to one embodiment. The signal $y_{FIR}[n]$ responds by stepping closer to the axis where y=0 and then oscillating around it until a second time $t_2$ that corresponds to the second time $t_2$ of time plot 300.

In one embodiment, the signal conditioner 104 enters into the third mode with the same step size but a larger integration time than the second mode. The third mode drives an almost monotonic movement, of the signal $y_{FIR}[n]$ around the axis where y=0 as shown in time plot 302.

After a third time $t_3$ in time plot 302 that corresponds to the third time $t_3$ in time plot 300, the signal conditioner 104 may enter a normal operating mode. In one embodiment, during the normal operating mode the signal conditioner 104 has larger integration time than any of the previous modes. In the normal operating mode the signal conditioner 104 may also have a smaller step size in the offset cancellation module 116.

FIG. 4 is an alternative time plot of the offset cancellation system response. In FIG. 4, only a portion of the time plot is displayed as a time plot 400. The time plot 400 magnifies a narrower range of the target offset to be removed to illustrate representative behavior of the offset cancellation system 114 from a step input to the signal conditioner 104.

The time plot 400 displays the analog offset u(t) when it approaches the magnitude of the sensed signal c(t) in the first mode. As previously discussed, the analog offset moves around the magnitude of the sensed signal c(t). As can be appreciated from the figure, the analog offset does not step on regular intervals. The integration time remains constant during each mode; however, the offset cancellation system 114 may include a dead band between high and low outputs, in which no action is directed. Thus, if the output of the filter 112 is not high enough or not low enough, the offset cancellation system may direct no step action, as can be observed in the varying periods of the oscillation.

The time plot 400 also depicts the impact of latency in the system that is caused by the integrator 206 and the latency of the system 104. This latency can be seen in the overshoot between the first time and the second time in time plot 400, in which the analog offset moves by more than one step in each direction. In this embodiment, the step is limited to 1 indicating that the system is stable.

In the embodiment shown in FIG. 4, the integration time is the same in the first mode and the second mode, but the third mode has a larger integration time than the first or second mode, and the normal operating mode has a larger integration time than the third mode.

Also shown in FIG. 4, the first mode has a step size that is greater than the second mode step size; however, the second mode has the same step size as the third mode and the normal operating mode.

Figure 5:
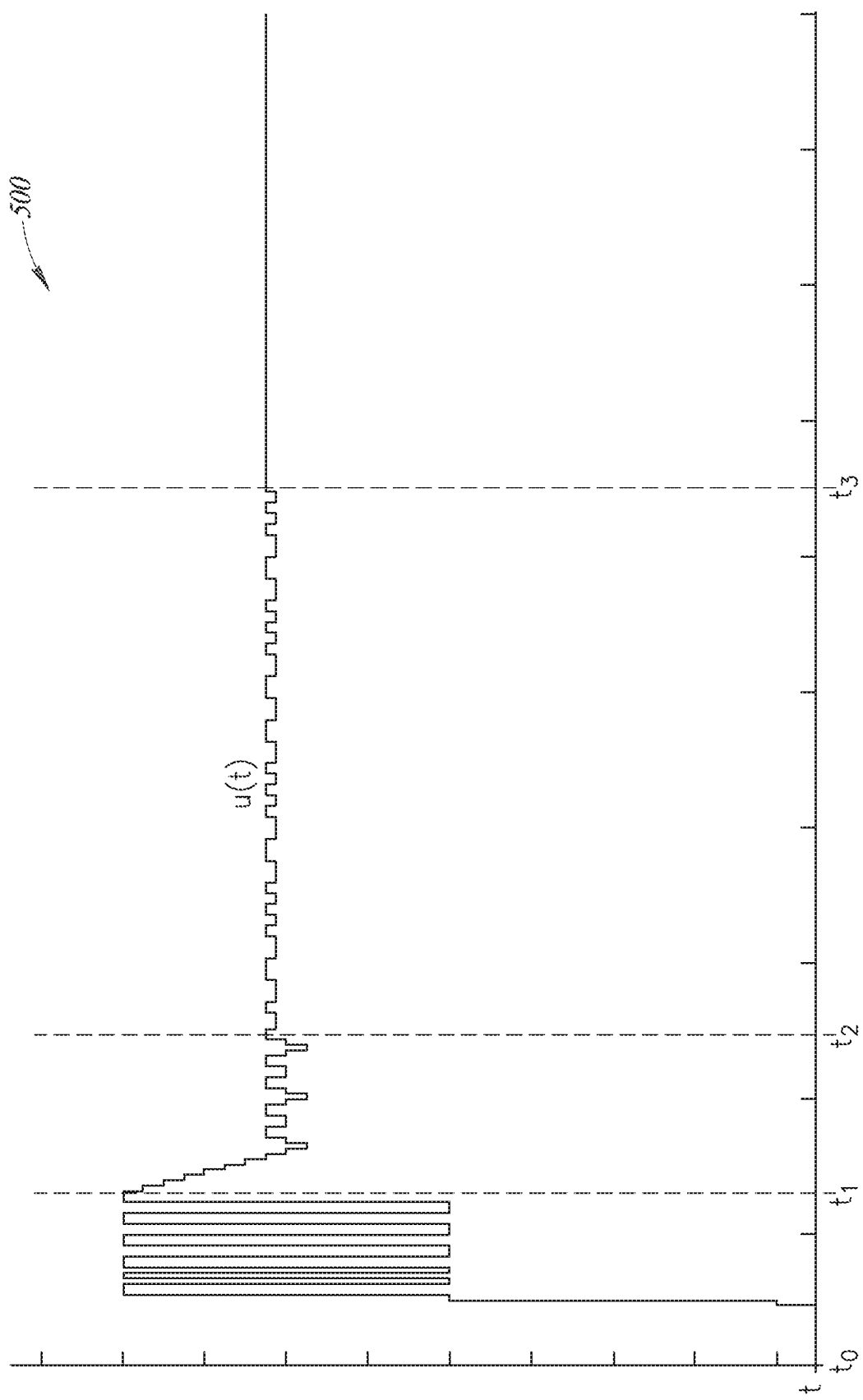
FIG. 5 is yet another alternative time plot of the offset cancellation system response.

FIG. 5 is yet another alternative time plot of the offset cancellation system response. In FIG. 5, only a portion of the time plot is displayed as a time plot 500. The time plot 500 magnifies a narrower range of the y-axis to illustrate representative behavior of the offset cancellation system 114 from a step input to the signal conditioner 104.

The time plot 500 displays the analog offset u(t) when it approaches the magnitude of the sensed signal c(t) in the first mode. The time plot 500 is similar in many respects to time plot 400; however, one notable difference is the relative step size in a third mode. The time plot 500 depicts a first mode between $t_0$ and $t_1$, a second mode between $t_1$ and $t_2$, and the third mode between $t_2$ and $t_3$. In time plot 500, u(t) has a first step size in the first mode that is greater than a second step size in the second mode, and the second step size is greater than a third step size in the third mode.

Figure 6:
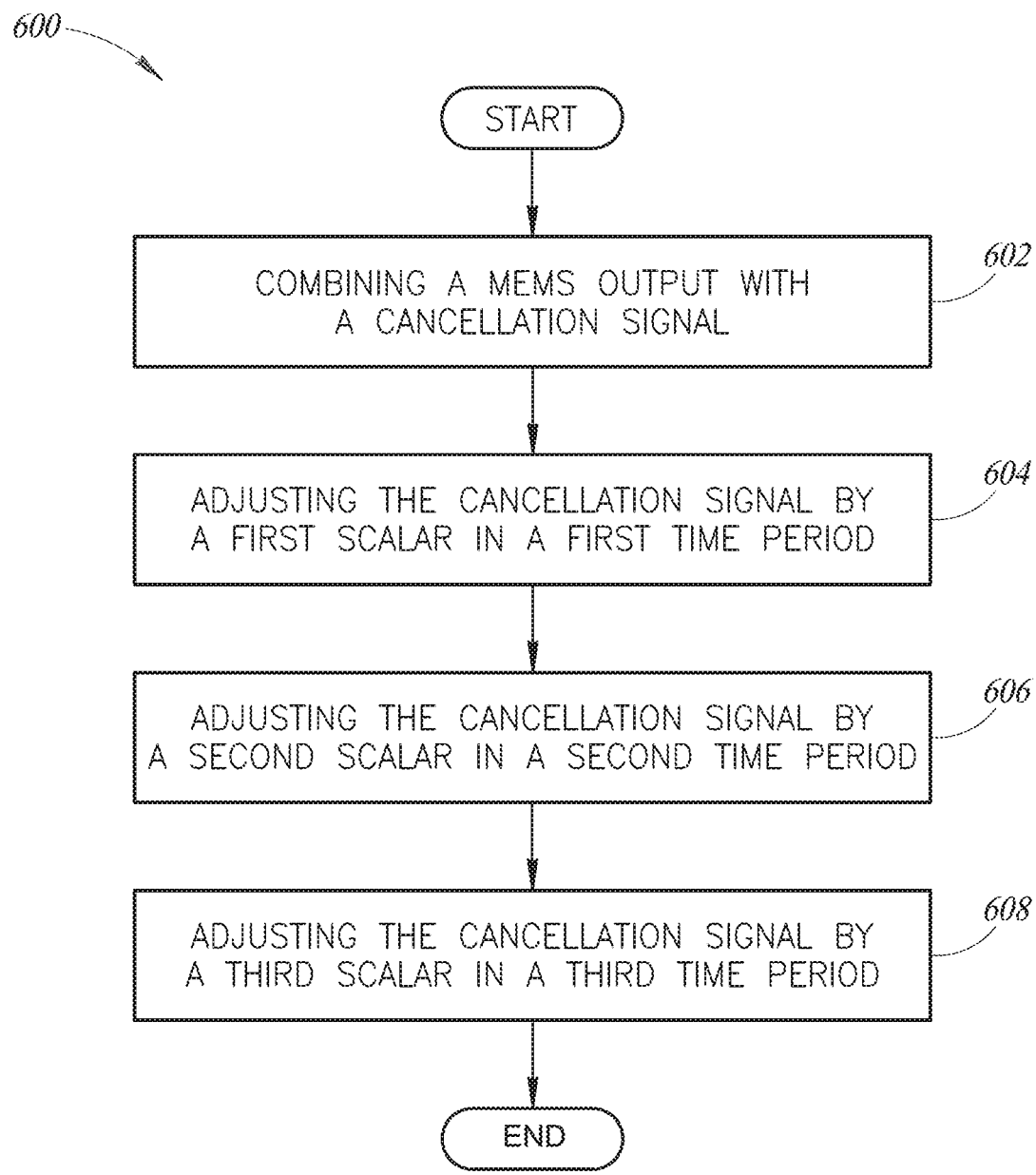
FIG. 6 is a flow chart showing one embodiment of the modes of the offset cancellation system.

FIG. 6 is a flow chart showing one embodiment of the modes of the offset cancellation system. The method 600 is implemented to remove a bias from an output signal of a MEMS sensor 102. Specifically, during the initialization of the MEMS sensor 102, the signal processor can be used to quickly remove a bias from the output signal of the MEMS 102.

The method 600 includes step 602 combining the MEMS output with a cancellation signal. The cancellation signal of step 602 may be at any value at a first instant of initialization of the MEMS 102 or the signal processor. This includes the cancellation signal starting at a zero, non-zero, or null baseline value at the first instant of initialization. The baseline value may be caused by transient signals or may be intentionally preset by the signal processor in anticipation of a predicted offset value.

In step 604, the signal processor can adjust the cancellation signal by a first scalar during a first time period. In one embodiment, the first time period falls within the first mode, as discussed with respect to the figures above. The first scalar can be any number, but in some embodiment is limited to integers of positive and negative value.

In step 606, the signal processor adjusts the cancellation signal by a second scalar during a second time period. The second time period may exclude the first time period by a margin, or may abut up against the first time period. The first and second time periods may also overlap in some embodiments. The second scalar can be any number, but in some embodiment is limited to integers of positive and negative value. The second scalar may be smaller than the first scalar, and in one embodiment is smaller by a factor of about 16.

In step 608, the signal processor adjusts the cancellation signal by a third scalar during a third time period. The third time period may exclude the second time period by a margin, or may abut up against the second time period. The first, second, and third time periods may also overlap in some embodiments. The third scalar can be any number, but in some embodiment is limited to integers of positive and negative value. The third scalar may be smaller than the second scalar, and in one embodiment is smaller by a factor of about 2.

In other embodiments, the cancellation signal is adjusted by incrementing the cancellation signal at a first step during the first time period, a second step in the second time period and a third step in the third time period. The incrementing is implemented by stepping the cancellation signal up or down by the magnitude of the first, second, and third step in the first, second, and third mode, respectively. A sign of the step is determined by a sign of the combination of the MEMS output and the cancellation signal. In some embodiments, the first step is greater than the second step, and the second step is greater than the third step.

Other embodiments may also include integration of the adjusted cancellation signal, the integration having a first integration interval in the first mode, a second integration interval in the second mode, and a third integration interval in the third mode. In one embodiment, the first integration interval is smaller than the second integration interval, and the second integration interval is smaller than the third integration interval. The varying integration intervals over the three modes may be used to progressively increase the dampening effect of the signal processor on changes of the combination of the MEMS output and the cancellation signal.

The present disclosure is directed to device and method for removing an offset from a signal during a startup sequence and during normal operation of a MEMS device. The removing may be performed by setting initial values of an integration time and slew rate limit in an offset cancellation system, and then adjusting the initial values of the integration time and slew rate limit after an initial startup period of the startup sequence. Prior art devices use a low pass filter to remove this offset; however, embodiments of the present disclosure use a sign detector, an integrator, and a divider to remove the offset.

One embodiment of the present disclosure is directed to an offset cancellation device that is configured to subtract a DC bias signal from an input signal received at a first input. The offset cancellation device also includes a processing module and an offset cancellation module. The offset cancellation module is configured to generate a DC bias signal in two modes based on an output signal of the processing module. The two modes include a first mode in which the offset cancellation module is configured to calculate the DC bias signal by integrating the output signal of the processing module over a first interval, which is a first slew rate. The second mode is a mode in which the offset cancellation circuit is configured to calculate the DC bias signal by integrating the output signal of the processing module over a second interval, the second interval being greater than the first interval, a second slew rate being smaller than a first slew rate.

The offset cancellation device may include a third mode in which the offset cancellation circuit is configured to calculate the DC bias signal by integrating the output signal of the processing module over a third interval, the third interval being greater than the second interval, a third slew rate being smaller than the second slew rate. The first and second intervals are a first and second discrete number of values, respectively.

The offset cancellation module includes an integrator coupled to an input of the offset cancellation module and a divider coupled between the integrator and an output of the offset cancellation module, the divider configured to divide an output of the integrator by the first interval in the first mode and the second interval in the second mode. In addition, the offset cancellation module is configured to limit the DC bias signal to a maximum slew rate. The circuit is configured to receive analog signals and output analog signals and the offset cancellation module is configured to receive digital signals and output analog signals. The offset cancellation module output is nonlinear with the offset cancellation module input.

Another embodiment of the present disclosure is directed to a device that includes a bias estimator configured to operate in a first mode and in a second mode, the bias estimator including a memory, a rounding circuit coupled to the memory, an averaging circuit coupled to the rounding circuit, the averaging circuit configured to average an output of the rounding circuit over a first interval in the first mode and a second interval in the second mode, the second interval being greater than the first interval, and an amplifier coupled to the averaging circuit, the amplifying circuit configured to amplify an output of the averaging circuit by a first multiplier in the first mode and a second multiplier in the second mode, the first multiplier being greater than the second multiplier.

Another embodiment of the present disclosure is directed to a system that includes a micro-electromechanical system and an offset cancellation device coupled to the micro-electromechanical system. The offset cancellation device includes a circuit configured to receive a first analog signal from the micro-electromechanical system and to output a first digital signal and a feedback loop coupled to the circuit, the feedback loop being configured to provide a second analog signal to the circuit based on the first digital signal, the circuit being configured to combine the first and second analog signal. The feedback loop being configured to calculate a first average of the first digital signal over a first interval and multiply the first average by a first scalar in a first mode and calculate a second average of the first digital signal over a second interval and multiply the second average by a second scalar in a second mode, the first interval being smaller than the second interval, and the first scalar being greater than the second scalar.

Another embodiment of the present disclosure is directed to an offset cancellation device that includes a combining circuit, a charge amplifier coupled to the combining circuit, the charge amplifier configured to detect a capacitance and to output a corresponding voltage, an analog-to-digital (ADC) converter coupled to the charge amplifier, a filter coupled to the ADC, a sign detector circuit coupled to the filter, an integrator coupled to the sign detector circuit, a divider coupled to the integrator, and a multiplier coupled to the divider and the combining circuit.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
receiving an output signal from a micro-electromechanical structure (MEMS) sensor; and
removing a bias from the output signal of the MEMS sensor, the removing including:
combining the output signal of the MEMS sensor with a cancellation signal;
during a first time period, adjusting the cancellation signal by a first scalar;
during a second time period, adjusting the cancellation signal by a second scalar that is smaller than the first scalar; and
during a third time period, adjusting the cancellation signal by a third scalar that is smaller than the second scalar.

2. The method of claim 1 wherein the adjusting the cancellation signal during the first, second and third time periods includes incrementing the cancellation signal by steps equal in magnitude to the first scalar in the first time period, the second scalar in the second time period, and the third scalar in the third time period, the steps having the same sign as the combined output signal and cancellation signal during the first, second and third time periods, respectively.

3. The method of claim 1 wherein the adjusting during the first time period occurs at a first frequency, the adjusting during the second time period occurs at a second frequency, and the adjusting during the third time period occurs at a third frequency, the first frequency being greater than the second frequency, and the second frequency being greater than the third frequency.

4. The method of claim 1 wherein the adjusting the cancellation signal includes:
integrating the cancellation signal over a first interval during the first time period;
integrating the cancellation signal over a second interval during the second time period; and
integrating the cancellation signal over a third interval during the third time period.

5. The method of claim 4 wherein the first interval is less than the second interval, and the second interval is less than the third interval.

6. The method of claim 4, further comprising:
dynamically adjusting at least one of the first interval, the second interval, and the third interval.

7. A method, comprising:
generating, by a micro-electromechanical structure (MEMS) sensor, a sensing signal including an offset;
receiving, by a signal detector, the sensing signal;
generating, by a feedback loop coupled to the signal detector, a cancellation signal;
combining, by a combiner, the sensing signal with the cancellation signal; and
adjusting the cancellation signal by at least one scalar,
wherein the adjusting the cancellation signal by at least one scalar includes:
during a first time period, adjusting the cancellation signal by a first scalar;
during a second time period, adjusting the cancellation signal by a second scalar that is smaller than the first scalar; and
during a third time period, adjusting the cancellation signal by a third scalar that is smaller than the second scalar.

8. The method of claim 7 wherein the generating the sensing signal includes generating the sensing signal as at least one of an electrical, mechanical, or optical signal.

9. The method of claim 7 wherein the MEMS sensor comprises an accelerometer having a sensing range of +/−240 g of acceleration and a sensitivity of about 17 least significant bits (LSB)/g.

10. The method of claim 7 wherein the combiner comprises at least one of an adder, a subtractor, a compiler, or a summer.

11. The method of claim 7 wherein the generating, by the feedback loop, the cancellation signal includes:
amplifying, by a charger amplifier, an output of the combiner;
converting an output of the charge amplifier into a digital output signal;
filtering, by a digital low pass filter, the digital output signal; and
generating the cancellation signal based on an output of the digital low pass filter.

12. The method of claim 11 wherein the generating the cancellation signal based on the output of the digital low pass filter includes:
generating a digital offset signal based on the output of the digital low pass filter; and
generating the cancellation signal by converting, by a digital to analog converter, the digital offset signal into an analog offset signal.

13. The method of claim 11 wherein the digital low pass filter has a sampling frequency of about 16 kHz and a step response period of about 1.5 ms.

14. The method of claim 7 wherein the adjusting the cancellation signal during the first, second and third time periods includes incrementing the cancellation signal by steps equal in magnitude to the first scalar in the first time period, the second scalar in the second time period, and the third scalar in the third time period, the steps having the same sign as the combined sensing signal and cancellation signal during the first, second and third time periods, respectively.

* * * * *